US012757561B1

(12) United States Patent
Choi

(10) Patent No.: US 12,757,561 B1
(45) Date of Patent: Oct. 6, 2026

(54) BI-FACIAL LIGHT-RECEIVING SILICON/PEROVSKITE TANDEM SOLAR CELL

(71) Applicant: HANWHA SOLUTIONS CORPORATION, Seoul (KR)

(72) Inventor: In Young Choi, Seongnam-si (KR)

(73) Assignee: HANWHA SOLUTIONS CORPORATION, Seoul (KR)

( * ) Notice: Subject to any disclaimer, the term of this patent is extended or adjusted under 35 U.S.C. 154(b) by 0 days.

(21) Appl. No.: 19/352,028

(22) Filed: Oct. 7, 2025

Related U.S. Application Data

(63) Continuation of application No. 19/106,300, filed as application No. PCT/KR2023/014089 on Sep. 18, 2023.

(30) Foreign Application Priority Data

Sep. 30, 2022 (KR) ........................ 10-2022-0124863

(51) Int. Cl.
*H10K 30/57* (2023.01)
*H10F 10/172* (2025.01)
*H10K 30/40* (2023.01)

(52) U.S. Cl.
CPC ........... *H10K 30/57* (2023.02); *H10F 10/172* (2025.01); *H10K 30/40* (2023.02)

(58) Field of Classification Search
CPC ....... H10K 30/57; H10K 30/40; H10F 10/172
See application file for complete search history.

(56) References Cited

U.S. PATENT DOCUMENTS

2021/0126147 A1 4/2021 Lee et al.
2021/0288204 A1 9/2021 Eaglesham et al.
2022/0416107 A1 12/2022 Yu et al.
2023/0092881 A1* 3/2023 Lee ........................ H10F 10/165 136/256

FOREIGN PATENT DOCUMENTS

CN 114188422 A 3/2022
JP 2015185808 A 10/2015
KR 10-2018-0084825 A 7/2018
KR 10-1901068 B1 9/2018
KR 10-2019-0010197 A 1/2019
KR 10-2020-0006791 A 1/2020
WO 2014083804 A1 5/2014
WO WO-2019116031 A1 * 6/2019 ........... H10F 10/166
WO 2021127654 A1 6/2021
WO WO-2021177552 A1 * 9/2021 ............. H10K 30/88
(Continued)

OTHER PUBLICATIONS

International Search Report for PCT/KR2023/014089 dated Jan. 10, 2024.
(Continued)

*Primary Examiner* — Lindsey A Buck
(74) *Attorney, Agent, or Firm* — Sughrue Mion, PLLC

(57) ABSTRACT

The present disclosure relates to a tandem solar cell and, more specifically, to a bi-facial light-receiving silicon/perovskite tandem solar cell capable of obtaining a remarkably high photoelectric conversion efficiency by having increased light absorption from the bottom part thereof.

16 Claims, 4 Drawing Sheets

(56) References Cited

FOREIGN PATENT DOCUMENTS

| | | | |
|---|---|---|---|
| WO | 2022/066707 | A1 | 3/2022 |
| WO | 2022102128 | A1 | 5/2022 |

OTHER PUBLICATIONS

Dupré et al., "Design Rules to Fully Benefit From Bifaciality in Two-Terminal Perovskite/Silicon Tandem Solar Cells", IEEE Journal of Photovoltaics, vol. 10, No. 3, May 2020, pp. 714-721.
De Bastiani et al., "Efficient bifacial monolithic perovskite/silicon tandem solar cells via bandgap engineering", Nature Energy, vol. 6, Feb. 2021, pp. 167-175 (11 pages).
Communication issued Mar. 17, 2026 in Japanese Patent Application No. 2025-514607.
Ehsan Raza et al., "Review on two-terminal and four-terminal crystalline-silicon/perovskite tandem solar cells; progress, challenges, and future perspectives", Energy Reports, Apr. 29, 2022, vol. 8, pp. 5820-5851, [DOI:10.1016/j.egyr.2022.04.028].
Communication issued Aug. 18, 2026 in Japanese Patent Application No. 2025-514607.

* cited by examiner

[FIG. 1]
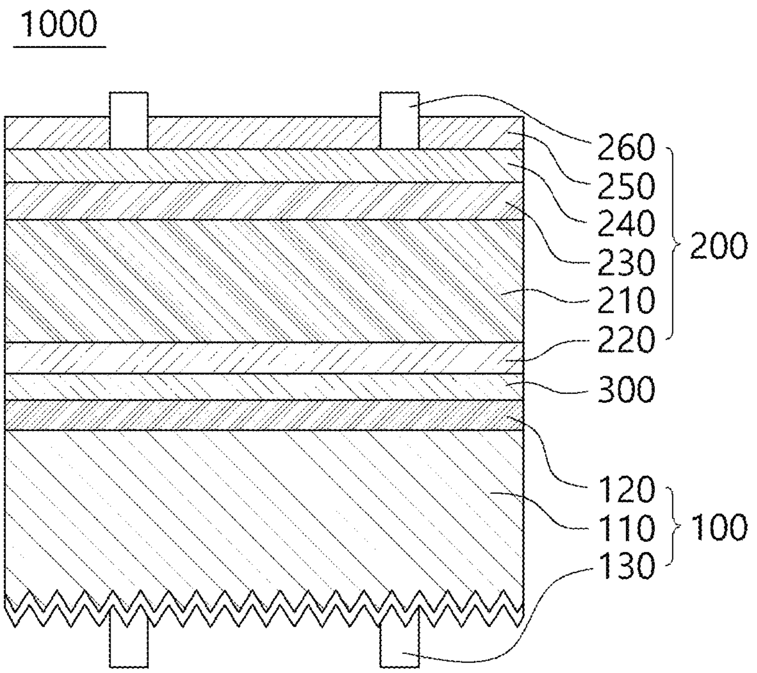
[FIG. 2]
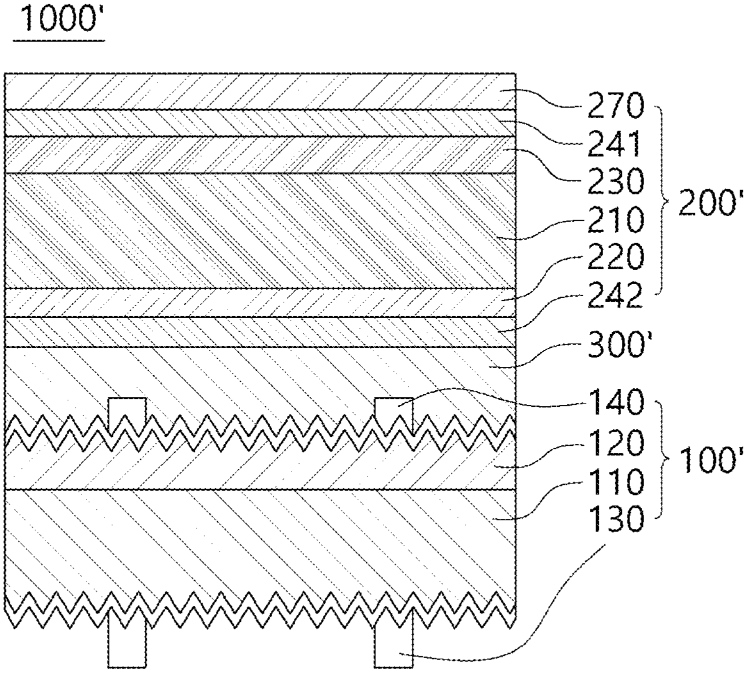

[FIG. 3]
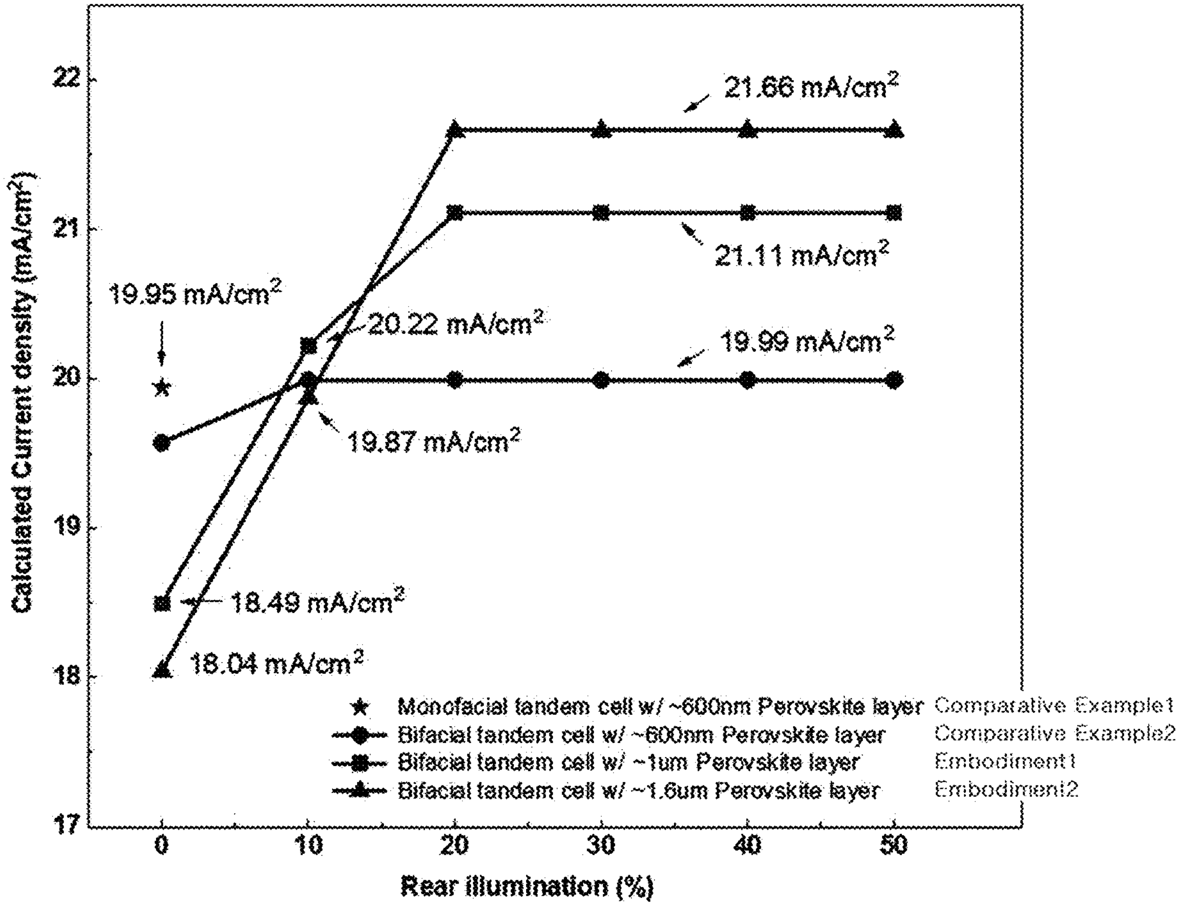

[FIG. 4]
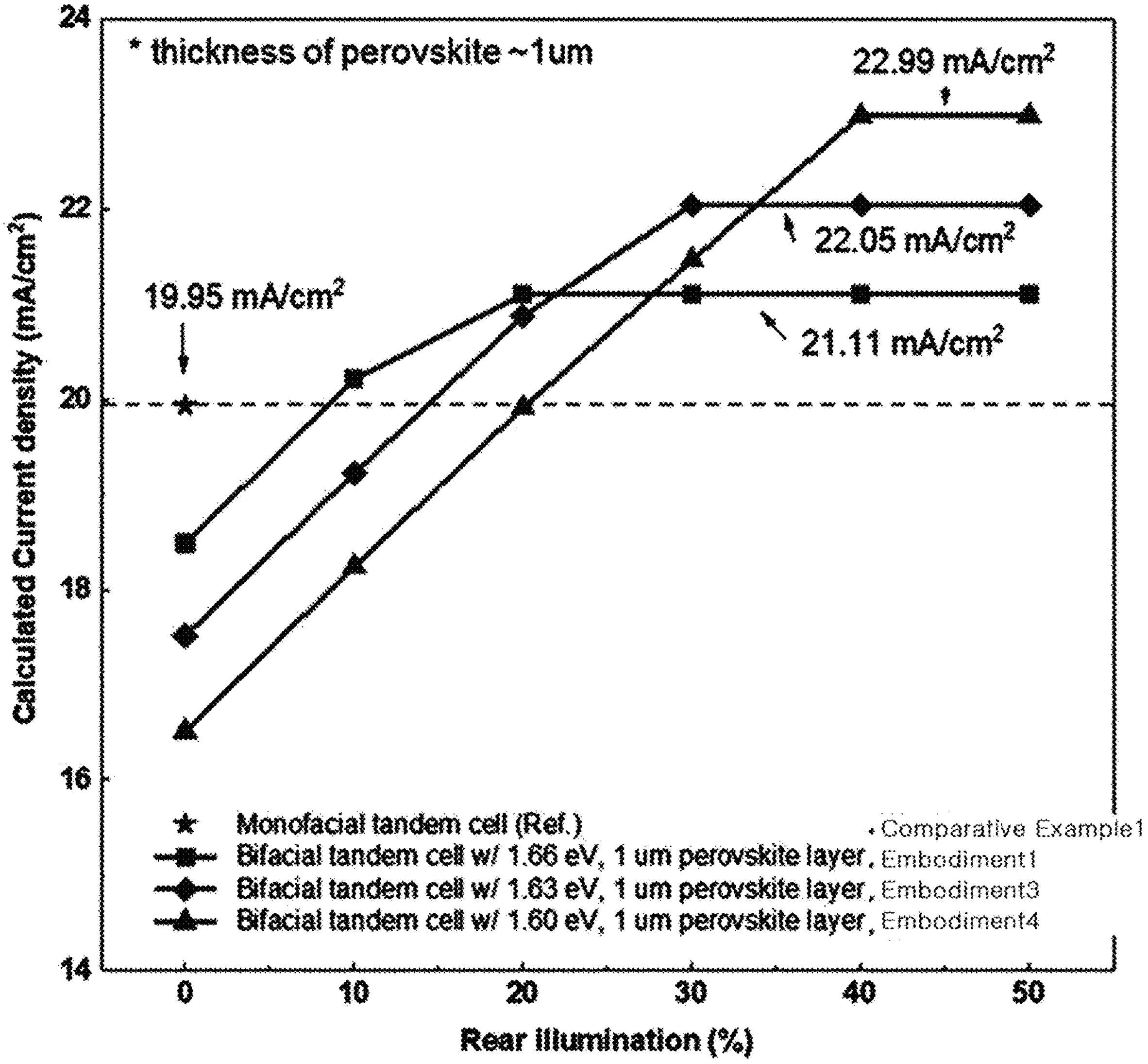

[FIG. 5]
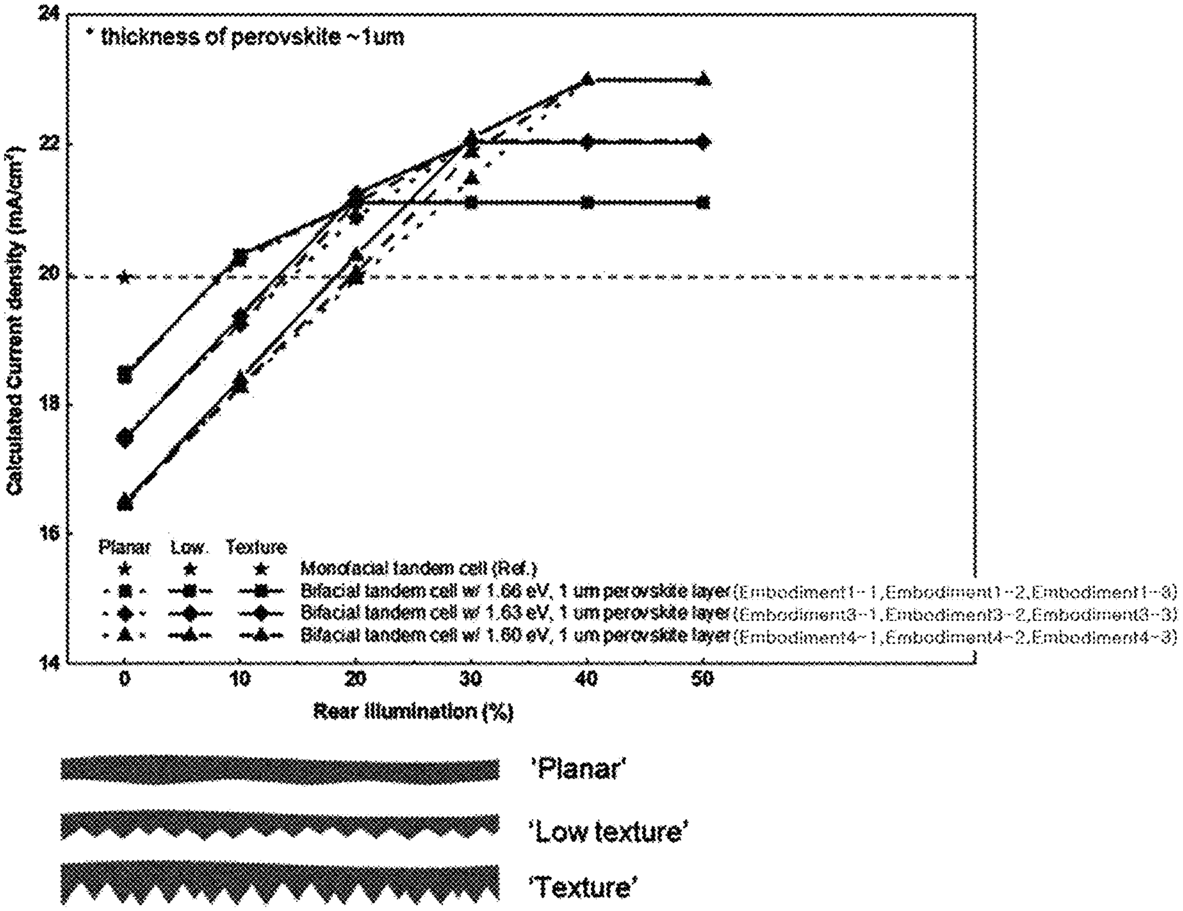

BI-FACIAL LIGHT-RECEIVING SILICON/PEROVSKITE TANDEM SOLAR CELL

CROSS REFERENCE TO RELATED APPLICATIONS

This is a Continuation Application of U.S. application Ser. No. 19/106,300 filed Feb. 25, 2025, which is a National Stage of International Application No. PCT/KR2023/014089 filed Sep. 18, 2023, claiming priority based on Korean Patent Application No. 10-2022-0124863 filed Sep. 30, 2022. U.S. application Ser. No. 19/328,573 is filed Sep. 15, 2025 as another Continuation Application of said U.S. application Ser. No. 19/106,300.

TECHNICAL FIELD

The present disclosure relates to a tandem solar cell, and more particularly, to a bifacial light-receiving silicon/perovskite tandem solar cell capable of obtaining significantly high photoelectric conversion efficiency by increasing light absorption in a lower side.

BACKGROUND ART

A multi-junction (tandem) solar cell is an attempt to effectively utilize solar energy over a wide wavelength range by vertically stacking light-absorbing layers with different band gaps, thereby minimizing thermalization loss. Specifically, the tandem solar cell allows the light-absorbing layers having different band gaps to absorb solar light by wavelength regions, so that it is possible to overcome the limitations of the efficiency of a single-junction solar cell with a principle of minimizing the loss of excess energy of the electron-hole energy as thermalization when a photon with energy greater than the band gap is absorbed by the light-absorbing layer in the single-junction solar cell. Recently, as interest in tandem solar cells as the next generation solar cell with the highest feasibility has increased, research and development competition to preoccupy tandem solar cell technologies of various structures is fiercely underway all over the world.

Meanwhile, conventional tandem solar cells are related to a two-terminal tandem solar cell, in which are manufactured by forming a recombination layer on a lower silicon solar cell, and then forming an upper perovskite solar cell thereon, where a lower electrode is formed as a front electrode, or are related to a four-terminal tandem solar cell, in which are manufactured by bonding the perovskite solar cell on a lower silicon solar cell through an intermediate layer.

However, in the case of the conventional tandem solar cells, since the lower electrode is formed as the front electrode, it is not possible to absorb light reflected by the surrounding environment from the backside of the device, so there is a problem that there is a limitation in the maximum current value.

Therefore, it is urgent to study a tandem solar cell capable of solving the above-described problem and increasing light absorption at the backside to obtain significantly high photoelectric conversion efficiency.

DISCLOSURE

Technical Problem

The present disclosure has been devised to overcome the above problem, and it is an object of the present disclosure to provide a bifacial light-receiving silicon/perovskite tandem solar cell capable of increasing light absorption at the backside to obtain significantly high photoelectric conversion efficiency.

Technical Solution

In order to solve the above-described problem, the present disclosure provides a bifacial light-receiving silicon/perovskite tandem solar cell, including a silicon lower cell configured to include a silicon layer and include a first grid electrode disposed on a lower surface of the silicon layer, a perovskite upper cell configured to include a perovskite absorbing layer with a thickness of greater than 600 nm to 2,000 nm, and an interconnecting layer configured to connect the silicon lower cell and the perovskite upper cell to each other, wherein the silicon layer of the silicon lower cell comprises a crystalline silicon substrate and further includes a p-type amorphous silicon layer, an n-type amorphous silicon layer, and an amorphous intrinsic silicon layer each disposed on the crystalline silicon substrate, thereby forming a heterojunction with intrinsic thin layer (HJT) structure.

According to an embodiment of the present disclosure, the perovskite absorbing layer may have a thickness of greater than 600 nm.

In addition, the perovskite absorbing layer may have a thickness of 650 nm to 1,700 nm.

In addition, the perovskite upper cell is configured to have a band gap of less than 1.66 eV.

In addition, the silicon lower cell may further include a passivation layer on the lower surface of the silicon layer, and the first grid electrode may be disposed on the passivation layer.

In addition, the silicon layer may be a p-type silicon layer, and the silicon lower cell may further include an n-type emitter layer on an upper surface of the silicon layer.

In addition, the interconnecting layer may be a recombination layer or an intermediate layer including at least one selected from the group consisting of a transparent conductive oxide, a carbonaceous conductive material, a metallic material, and a conductive polymer.

In addition, the bifacial light-receiving silicon/perovskite tandem solar cell may be a two-terminal bifacial light-receiving silicon/perovskite tandem solar cell in which the perovskite upper cell further includes a second grid electrode on an upper side of the perovskite absorbing layer, when the interconnecting layer is a recombination layer, and the bifacial light-receiving silicon/perovskite tandem solar cell may be a four-terminal bifacial light-receiving silicon/perovskite tandem solar cell in which the silicon lower cell further includes a second grid electrode partially recessed in an intermediate layer on the silicon layer, when the interconnecting layer is the intermediate layer.

In addition, the silicone lower cell may be configured such that at least a portion of its lower surface is formed with pyramid-shaped concavo-convex structure, and the pyramid-shaped concavo-convex structure has a pyramid angle of greater than 5°.

Advantageous Effects

The bifacial light-receiving silicon/perovskite tandem solar cell according to the present disclosure has the effect of increasing light absorption at the backside to obtain significantly high photoelectric conversion efficiency.

DESCRIPTION OF DRAWINGS

FIG. 1 is a cross-sectional schematic diagram of a bifacial light-receiving silicon/perovskite tandem solar cell according to an embodiment of the present disclosure.

FIG. 2 is a cross-sectional schematic diagram of a bifacial light-receiving silicon/perovskite tandem solar cell according to another embodiment of the present disclosure.

FIG. 3 is a graph of current values according to illumination rates of bifacial light-receiving silicon/perovskite tandem solar cells according to Embodiment 1, Embodiment 2, Comparative Example 1 and Comparative Example 2.

FIG. 4 is a graph of current values according to illumination rates of bifacial light-receiving silicon/perovskite tandem solar cells according to Embodiment 1, Embodiment 3, Embodiment 4 and Comparative Example 1.

FIG. 5 is a graph of current values according to illumination rates of bifacial light-receiving silicon/perovskite tandem solar cells according to Embodiment 1-1 to 1-3, Embodiment 3-1 to 3-3 and Embodiment 4-1 to 4-3.

BEST MODE OF THE EMBODIMENTS

Hereinafter, an embodiment of the present disclosure will be described in detail so that it may be easily performed by a person with ordinary skills in the art to which the present disclosure belongs. The present disclosure may be implemented in various different forms and is not limited to the embodiments described herein.

As described above, in the case of a conventional tandem solar cell, since the lower electrode is formed as the front electrode, it is not possible to absorb light reflected by the surrounding environment from the backside of the device, so there is a limitation in the maximum current value.

Accordingly, the present disclosure seeks to solve the above-described problem by providing a bifacial light-receiving silicon/perovskite tandem solar cell including a silicon lower cell configured to include a silicon layer and include a first grid electrode disposed on a lower surface of the silicon layer, a perovskite upper cell configured to include a perovskite absorbing layer with a thickness of greater than 600 nm to 2,000 nm, and an interconnecting layer configured to connect the silicon lower cell and the perovskite upper cell to each other.

Through this, the present disclosure may increase light absorption at the backside to obtain significantly high photoelectric conversion efficiency.

In the present specification, the lower cell means a silicon solar cell formed at the lower side of the tandem solar cell, and the upper cell means a perovskite solar cell formed at the upper part of the tandem solar cell.

In addition, the silicon lower cell in this specification means a solar cell including silicon as a light-absorbing layer, and the perovskite upper cell means a solar cell including a material having a perovskite structure as a light-absorbing layer.

Hereinafter, the tandem solar cell device according to the present disclosure will be described in detail with reference to the drawings.

As shown in FIGS. 1 and 2, a bifacial light-receiving silicon/perovskite tandem solar cell 1,000 (or 1,000') according to the present disclosure is implemented by including a silicon lower cell 100 (or 100'), a perovskite upper cell 200 (or 200'), and an interconnecting layer 300 (or 300') connecting the silicon lower cell 100 (or 100') and the perovskite upper cell 200 (or 200') to each other.

First, the silicon lower cell 100 (or 100') will be described.

The silicon lower cell 100 (or 100') may include a silicon layer 110, and may further include an emitter layer 120 on an upper surface of the silicon layer 110.

The silicon layer 110 includes a crystalline silicon substrate (not shown), a p-type amorphous or crystalline silicon layer (not shown), an n-type amorphous or crystalline silicon layer (not shown), and an amorphous intrinsic silicon layer (not shown), which together constitute a heterojunction with intrinsic thin layer (HJT) structure.

In addition, the silicon lower cell 100 (or 100') includes a first grid electrode 130 disposed on a lower surface of the silicon layer 110. Accordingly, light absorption for light reflected from the backside may be increased, thereby increasing the current value and exhibiting high photoelectric conversion efficiency.

Meanwhile, the silicon lower cell 100 (or 100') may further include a passivation layer on the lower surface of the silicon layer 110, and the first grid electrode 130 may be disposed on the passivation layer. However, the present disclosure is not limited thereto.

At least a portion of the lower surface of the silicon lower cell 100 (or 100') may be textured with pyramid-shaped concavo-convex structure in order to improve light efficiency. That is, a concavo-convex surface (see FIGS. 1 and 2) is formed in a direction in which light is incident, and a path of light incident on the silicon layer 110 is increased through a light scattering effect of light incident through the concavo-convex surface to improve light collection, thereby increasing an absorption rate of solar light, and thus achieve a high current value. In this case, the texturing may have a pyramid angle of the surface greater than 5°, preferably the pyramid angle of the surface exceeding 30°, and thus may be more advantageous in achieving the purpose of the present disclosure.

Meanwhile, the bifacial light-receiving silicon/perovskite tandem solar cell according to another embodiment of the present disclosure may be a four-terminal bifacial light-receiving silicon/perovskite tandem solar cell, in which the silicon lower cell 100 (or 100') further includes a second grid electrode 140 disposed on an upper side of the silicon layer 110, preferably on the emitter layer 120, as shown in FIG. 2.

Next, the perovskite upper cell 200 (or 200') will be described.

The perovskite upper cell 200 (or 200') is a cell connected to the silicon lower cell 100 (or 100') described above, and may have a band gap of less than 1.66 eV, and may be implemented by including a perovskite absorbing layer 210.

Meanwhile, the bifacial light-receiving silicon/perovskite tandem solar cell according to one embodiment of the present disclosure may include, stacked on the interconnecting layer 300 described later, a hole transport layer 220, a perovskite absorbing layer 210, an electron transport layer 230, a transparent electrode layer 240, an antireflection film 250, and a second grid electrode 260, as shown in FIG. 1.

In addition, the bifacial light-receiving silicon/perovskite tandem solar cell according to another embodiment of the present disclosure is configured such that a transparent electrode layer 242, a hole transport layer (or electron transport layer) 220, a perovskite absorbing layer 210, a hole transport layer (or electron transport layer) 230, a transparent electrode layer 241, and a glass 270 may be sequentially stacked on an interconnecting layer 300' to be described later, as shown in FIG. 2. In this case, when one of the hole transport layer or electron transport layer 220 on the transparent electrode layer 242 is a hole transport layer, one of the other hole transport layer or electron transport layer 230 may be an electron transport layer, and on the contrary, when one of the hole transport layer or electron transport layer 220 on the transparent electrode layer 242 is an electron transport layer, one of the other hole transport layer or electron transport layer 230 may be a hole transport layer. Preferably, the bifacial light-receiving silicon/perovskite tandem solar cell according to another embodiment of the present disclosure is configured such that the transparent electrode layer 242, the hole transport layer 220, the perovskite absorbing layer 210, the electron transport layer 230, the transparent electrode layer 241, and the glass 270 may be stacked.

The perovskite absorbing layer 210 may be formed so that the hole-electron pair generated by receiving light energy from the sun may be separated into electrons or holes. In an embodiment, electrons formed in the perovskite absorbing layer 210 may be transferred to the electron transport layer 230, and holes formed in the perovskite absorbing layer 210 may be transferred to the hole transport layer 220.

At this time, the perovskite absorbing layer 210 may include an organic halide perovskite such as methylammonium Iodide (MAI), formamidinium Iodide (FAI) or a metal halide perovskite such as lead iodide ($PbI_2$), bromine iodide (PbBr), and lead chloride ($PbCl_2$). That is, the perovskite absorbing layer 210 may be a multilayer stacked structure including at least one of organic halide perovskite or metal halide perovskite. More specifically, the perovskite absorbing layer 210 may be represented by $AMX_3$ (wherein, A is a monovalent organic ammonium cation or metal cation; M is a divalent metal cation; X is a halogen anion.). Non-limiting examples thereof may include $CH_3NH_3PbI_3$, $CH_3NH_3PbI_xCl_{3-x}$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$ (0=x, y=1).

In addition, the perovskite absorbing layer 210 may have a thickness of greater than 600 nm to 2,000 nm, and preferably have a thickness of 650 nm to 1,700 nm. If the perovskite absorbing layer has a thickness of 600 nm or less, even if the current of the lower cell increases, the current is limited by the upper cell so that current matching occurs, and thus the current value may not increase due to an increase in the rear illumination rate to a desired level, and if the thickness exceeds 2,000 nm, the performance of the device may decrease due to the limitation of the solution process, such as a decrease in the thin film grain size, an increase in defect sites, and an increase in surface roughness, which may limit the movement of electric charges.

The hole transport layer 220 serves to separate and transfer the holes formed in the perovskite absorbing layer 210, and may be formed of a common material known in the art as long as it meets the purpose of the present disclosure. Non-limiting examples thereof may include Mo oxide, Ni oxide, W oxide, Cu oxide, V oxide, CusCN, and CuI.

In addition, the electron transport layer 230 serves to separate and transfer the electrons formed in the perovskite absorbing layer 210, and may be formed of a common material known in the art as long as it meets the purpose of the present disclosure. Non-limiting examples thereof may include Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, In oxide, and SrTi oxide.

In addition, the transparent electrode layer 240 (or 241 and 242) perform a function of transferring electric charges to a metal electrode (i.e., the second grid electrode). The transparent electrode layer 240 (or 241 and 242) may be implemented by including at least one selected from the group consisting of a transparent conductive oxide, a carbonaceous conductive material, a metallic material, and a conductive polymer, preferably including the transparent conductive oxide.

Meanwhile, the antireflection film 250, the second grid electrode 260, and the glass 270 may be used without limitation as long as they may be commonly used in the art, so the present disclosure does not particularly limit this.

The perovskite upper cell 100 (or 100') of the bifacial light-receiving silicon/perovskite tandem solar cell 1,000 (or 1,000') according to the present disclosure may have the band gap of less than 1.66 eV as described above, and preferably a band gap of 1.63 eV or less. If the band gap of the perovskite upper cell exceeds 1.66 eV, the increase in current value may be insignificant even if the backside light irradiation rate increases, and thus it may be difficult to achieve the purpose of the present disclosure. On the other hand, the band gap of the perovskite upper cell may be achieved through the control of the perovskite composition of the $ABX_3$ structure (for forming a low band gap of perovskite, increase the $CH_3NH_3$— content or decrease the Br content among the perovskite compositions such as $CH_3NH_3PbI_3$, $CH_3NH_3PbI_xCl_{3-x}$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$).

Next, the interconnecting layer 300 (or 300') will be described.

The interconnecting layer 300 (or 300') may connect the silicon lower cell 100 (or 100') and the perovskite upper cell 200 (or 200') to each other, and play a role in physically coupling and electrically connect the silicon lower cell 100 (or 100') and the perovskite upper cell 200 (or 200'), and perform electric charges recombination between the upper cell and the lower cell.

The interconnecting layer 300 (or 300') may be used without limitation as long as the materials of the interconnecting layers commonly used in the art, but for the purpose of the present disclosure, they may preferably include at least one selected from the group consisting of a transparent conductive oxide, a carbonaceous conductive material, a metallic material, and a conductive polymer, and more preferably, they may be at least one TCO-based material and/or nc-Si:H material layer selected from the group consisting of ITO (Indium Tin Oxide), ICO (Indium Cerium Oxide), IWO (Indium Tungsten Oxide), ZITO (Zinc Indium Tin Oxide), ZIO (Zinc Indium Oxide), ZTO (Zinc Tin Oxide), GITO (Gallium Indium Tin Oxide), GIO (Gallium Indium Oxide), GZO (Gallium Zinc Oxide), AZO (Aluminum doped Zinc Oxide), FTO (Fluorine Tin Oxide), and ZnO.

Meanwhile, the interconnecting layer 300 (or 300') may have a thickness of 5 to 50 nm, and more preferably, a thickness of 10 to 30 nm. If the thickness of the interconnecting layer exceeds 50 nm, there may be a problem that current loss occurs due to an increase in parasitic absorption and efficiency decreases due to shunt paths caused by decreased horizontal resistance. In addition, if the thickness of the interconnecting layer is less than 5 nm, recombination reduces and efficiency decreases due to restricted electron movement.

The interconnecting layer 300 (or 300') may be a recombination layer 300 or an intermediate layer 300'. When the interconnecting layer 300 (or 300') are the recombination layer 300, the bifacial light-receiving silicon/perovskite tandem solar cell 1,000 may be a two-terminal bifacial light-receiving silicon/perovskite tandem solar cell in which the perovskite upper cell 200 further includes a second grid electrode 260 on an upper side of the perovskite absorbing layer 210. In addition, when the interconnecting layer 300 (or 300') is the intermediate layer 300', the bifacial light-receiving silicon/perovskite tandem solar cell 1,000' may be a four-terminal bifacial light-receiving silicon/perovskite tandem solar cell in which the silicon lower cell 100' further includes a second grid electrode 140 partially recessed in the intermediate layer 300' on the silicon layer 110.

Although the tandem solar cell device according to the present disclosure has been described above, this is merely exemplary, and it may further include an additional stacked structure capable of improving solar cell efficiency.

The present disclosure will be described in further detail below through the following embodiments, but the following embodiments are not limiting the scope of the present disclosure, and this should be interpreted to aid in the understanding of the present disclosure.

DETAILED DESCRIPTION OF THE EMBODIMENTS

Embodiment 1: Manufacturing of a Two-Terminal Tandem Solar Cell Device

First, a passivation layer was formed on a lower side of a PERC structure cell in which an $n^{++}$ emitter layer was formed on a silicon layer doped with p-type impurities through a POCl process, and an Al paste was formed through a printing process to form a silicon lower cell. On the other hand, a lower surface of the silicon lower cell was textured so that a pyramid angle of the surface was greater than 300 to less than 60° and the average pyramid angle was 46°.

Thereafter, an ITO (Indium Tin Oxide) layer is formed on the emitter layer as an interconnecting layer which is a recombination layer to have a thickness of 20 nm.

In addition, on the recombination layer, a hole transport layer was formed by sputter depositing $NiO_x$ with a thickness of −20 nm under high vacuum conditions, and a perovskite absorbing layer with a band gap of 1.66 eV and a thickness of 1,000 nm was formed through a perovskite solution spin coating process, and an electron transport layer with a thickness of −20 nm was formed through a thermal evaporator and an ALD equipment, and an IZO (Indium doped Zinc Oxide) was formed with a thickness of −80 nm as a transparent electrode layer through a sputter equipment on the electron transport layer. After that, an antireflection film was formed through a thermal evaporator, and a second grid electrode patterned with silver (Ag) was formed through the thermal evaporator to form a perovskite upper cell, thereby manufacturing a two-terminal bifacial light-receiving silicon/perovskite tandem solar cell.

Embodiment 2

Perform the same as the Embodiment 1, but a two-terminal bifacial light-receiving silicon/perovskite tandem solar cell was manufactured by changing the thickness of the perovskite absorbing layer to 1,600 nm.

Comparative Example 1

Perform the same as the Embodiment 1, but a conventional mono-facial photosensitive silicon/perovskite tandem solar cell was manufactured in which a lower electrode was formed without forming a first grid electrode on the silicon lower cell, and then the lower electrode was a front electrode.

Comparative Example 2

Perform the same as the Embodiment 1, but a two-terminal bifacial light-receiving silicon/perovskite tandem solar cell was manufactured by changing the thickness of the perovskite absorbing layer to 600 nm.

Experimental Example 1

For the Embodiment 1, the Embodiment 2, the Comparative Example 1 and the Comparative Example 2, the current value according to the rear illumination rate were calculated under the condition of illuminating the light of the AM1.5G optical spectrum to the front in the optical simulation and are shown in FIG. 3.

As a result, as shown in FIG. 3, in the case of a conventional mono-facial light-receiving silicon/perovskite tandem solar cell, the Comparative Example 1 had a current value of 19.95 $mA/cm^2$ under front illumination, and in the case of a bifacial light-receiving silicon/perovskite tandem solar cell, the Embodiment 1 (the thickness of the perovskite light-absorbing layer of 1,000 nm) showed a current value of 18.49 $mA/cm^2$ when there was no real illumination, but it showed a significantly higher current value of 21.11 $mA/cm^2$ when the real illumination rate was 10% or more, and a more significantly higher current value of about 21.11 $mA/cm^2$ when the real illumination rate was 20% or more In addition, in the case of Embodiment 2 (the thickness of the perovskite light-absorbing layer of 1,600 nm), when there is no rear illumination, the current value of 18.04 $mA/cm^2$ was shown, and when the rear illumination rate was 10%, it shows a current value of 19.87 $mA/cm^2$, but when the rear illumination rate was 20% or more, it shows a significantly higher current value of 21.66 $mA/cm^2$.

On the other hand, in the Comparative Example 2, which is a bifacial light-receiving silicon/perovskite tandem solar cell, but has a perovskite light-absorbing layer thickness of 600 nm, it shows a current value of 19.50 $mA/cm^2$ when there was no rear illumination, and even when the rear illumination rate is 10% or more, it shows the current value of 19.99 $mA/cm^2$, which is similar to the Comparative Example 1 and significantly lower than the Embodiment 1. In the case of the Comparative Example 2, which has a perovskite light-absorbing layer thickness of 600 nm, the current of the upper cell is limited even if the current increases in the lower cell, so that current matching occurs, and therefore, the current value increases only slightly even when the rear illumination rate increases.

Embodiment 3

Perform the same as the Embodiment 1, but a two-terminal bifacial light-receiving silicon/perovskite tandem solar cell was manufactured by changing the band gap of the perovskite absorbing layer to 1.63 eV.

Embodiment 4

Perform the same as the Embodiment 1, but a two-terminal bifacial light-receiving silicon/perovskite tandem solar cell was manufactured by changing the band gap of the perovskite absorbing layer to 1.60 eV.

Experimental Example 2

For the Embodiment 1, the Embodiment 3, and the Embodiment 4, the current value according to the rear illumination rate was calculated under the condition of illuminating the light of the AM1.5G optical spectrum to the front in the optical simulation and are shown in FIG. 4 (Comparative Example 1 is shown as a control group).

As a result, as shown in FIG. 4, the Embodiment 3, in which the band gap of the perovskite absorbing layer is 1.63 eV, exhibits a higher current value compared to Comparative Example 1 when the rear illumination rate is 15% or more, and shows a significantly high current value of about 22.05 $mA/cm^2$ when the rear illumination rate is 30% or more.

=In addition, the Embodiment 4, in which the band gap of the perovskite absorbing layer is 1.60 eV, exhibits a current value equal to or higher than the Comparative Example 1 when the rear illumination rate is 20% or more, and exhibits a significantly higher current value of about 22.99 $mA/cm^2$ when the rear illumination rate is 40% or more.

Embodiment 1-1

The two-terminal bifacial light-receiving silicon/perovskite tandem solar cell of the Embodiment 1 was used (the pyramid angle of the lower surface of the silicon lower cell was greater than 300 to less than 60° and the average pyramid angle was 46°).

Embodiment 1-2

Perform the same as the Embodiment 1-1, but a two-terminal bifacial light-receiving silicon/perovskite tandem solar cell was manufactured by changing the pyramid angle of the lower surface of the silicon lower cell to be greater than 5° to less than 30° and the average pyramid angle to be 18°.

Embodiment 1-3

Perform the same as the Embodiment 1-1, but a two-terminal bifacial light-receiving silicon/perovskite tandem solar cell was manufactured by changing the pyramid angle of the lower surface of the silicon lower cell to be 0° to 5° and the average pyramid angle to be 3°.

Embodiment 3-1

The two-terminal bifacial light-receiving silicon/perovskite tandem solar cell of Embodiment 3 was used (the pyramidal angle of the lower surface of the silicon lower cell was greater than 300 to less than 600 and the average pyramidal angle was 46°).

Embodiment 3-2

Perform the same as the Embodiment 3-1, but a two-terminal bifacial light-receiving silicon/perovskite tandem solar cell was manufactured by changing the pyramid angle of the lower surface of the silicon lower cell to be greater than 5° to less than 300 and the average pyramid angle to be 18°.

Embodiment 3-3

Perform the same as the Embodiment 3-1, but a two-terminal bifacial light-receiving silicon/perovskite tandem solar cell was manufactured by changing the pyramid angle of the lower surface of the silicon lower cell to be 0° to 5° and the average pyramid angle to be 3°.

Embodiment 4-1

The two-terminal bifacial light-receiving silicon/perovskite tandem solar cell of Embodiment 4 was used (where the pyramid angle of the lower surface of the silicon lower cell was higher than 30° to less than 60° and the average pyramid angle was 46°).

Embodiment 4-2

Perform the same as the Embodiment 4-1, but a two-terminal bifacial light-receiving silicon/perovskite tandem solar cell was manufactured by changing the pyramid angle of the lower surface of the silicon lower cell to be greater than 5° to less than 30° and the average pyramid angle to be 18°.

Embodiment 4-3

Perform the same as the Embodiment 4-1, but a two-terminal bifacial light-receiving silicon/perovskite tandem solar cell was manufactured by changing the pyramid angle of the lower surface of the silicon lower cell to be 0° to 5° and the average pyramid angle to be 3°.

Experimental Example 3

For the Embodiments 1-1 to 1-3 and the Embodiments 3-1 to 3-3 and Embodiments 4-1 to 4-3, the current value according to the rear illumination rate was calculated under the condition of illuminating the light of the AM1.5G optical spectrum to the front in the optical simulation and are shown in FIG. 5 (Comparative Example 1 is shown as a control group).

As a result, the difference in current value difference according to the lower surface texturing shape was different depending on the band gap of the perovskite absorbing layer and the rear illumination rate, and the lower the band gap, the more remarkable the current value difference according to the lower surface texturing shape depending on the increase in the rear illumination rate.

In the Embodiments 4-1 to 4-3, when the rear illumination rate was 20%, the difference in the current value according to the lower surface texturing shape began to appear, and when the rear illumination rate was 30%, the difference in the current value according to the lower surface texturing shape was the largest. At this time, the current value of Embodiment 4-1 was about 0.54 $mA/cm^2$ higher than that of Embodiment 4-3.

Embodiments 5 to 7

Perform the same as the Embodiment 1, but a two-terminal bifacial light-receiving silicon/perovskite tandem solar cell was manufactured by changing the thickness of the perovskite absorbing layer to 700 nm, 800 nm, and 900 nm, respectively.

Experimental Example 4

For the Embodiments 5 to 7, the current value according to the rear illumination rate was calculated under the condition of illuminating the light of the AM1.5G optical spectrum to the front in the optical simulation using a solar simulator equipment (not shown).

As a result, the Embodiment 5, in which the thickness of the perovskite absorbing layer is 700 nm, showed a current value of 20.5 mA/$cm^2$ when the real illumination rate is 20% or more, Embodiment 6, in which the thickness of the perovskite absorbing layer is 800 nm, showed a current value of 20.8 mA/$cm^2$ when the real illumination rate is 20% or more, and the Embodiment 5, where the thickness of the perovskite absorbing layer is 900 nm, showed a current value of 21 mA/$cm^2$ when the real illumination rate is 20% or more.

Although an embodiment of the present disclosure has been described above, the idea of the present disclosure is not limited to the embodiments presented in the present specification, and a person skilled in the art who understands the idea of the present disclosure can easily propose other embodiments by adding, changing, deleting, supplementing, etc. components within the same idea, but this is also said to be within the idea of the present disclosure.

<Cell Project>
Remaining Execution Period:
3rd year: 2021 Jan. 1-2022 Dec. 31
4th year: 2023 Jan. 1-2023 Sep. 30
[Supporting National R&D Program for this Invention]
[Project Unique Number] 1415174234
[Project Number] 20203040010320
[Ministry Name] Ministry of Trade, Industry and Energy
[Project Management (Specialized) Institution Name] Korea Energy Technology Evaluation Institute
[Research Project Name] Core Technology Development for Renewable Energy
[Research Title] Development of Technology for Manufacturing 26% Efficient, 6-Inch
Perovskite/Crystalline Silicon Tandem Solar Cells for Power Generation Increase
[Contribution Rate] 1/2
[Project Performing Organization Name] Hanwha Solutions Corporation
[Research Period] 2022 Jan. 1-2022 Dec. 31
<Module Project>
Remaining Execution Period:
2nd year: 2022 May 1-2022 Dec. 31
3rd year: 2023 Jan. 1-2023 Dec. 31
4th year: 2024 Jan. 1-2024 Oct. 30
[Supporting National R&D Program for this Invention]
[Project Unique Number] 1415176482
[Project Number] 20213030010400
[Ministry Name] Ministry of Trade, Industry and Energy
[Project Management (Specialized) Institution Name] Korea Energy Technology Evaluation Institute
[Research Project Name] Core Technology Development for Renewable Energy (R&D)
[Research Title] Development of Process Technology for High-Durability, High-Efficiency Perovskite/Crystalline Silicon Tandem Solar Modules
[Contribution Rate] 1/2
[Project Performing Organization Name] Hanwha Solutions Corporation
[Research Period] 2022 May 1-2022 Dec. 31

What is claimed is:

1. A bifacial light-receiving silicon/perovskite tandem solar cell, comprising:
- a silicon lower cell configured to include a silicon layer and include a first grid electrode disposed on a lower surface of the silicon layer;
- a perovskite upper cell configured to include a perovskite absorbing layer with a thickness of greater than 600 nm to 2,000 nm; and
- an interconnecting layer configured to connect the silicon lower cell and the perovskite upper cell to each other,
- wherein the silicon layer of the silicon lower cell comprises a crystalline silicon substrate and further includes a p-type amorphous silicon layer, an n-type amorphous silicon layer, and an amorphous intrinsic silicon layer each disposed on the crystalline silicon substrate, thereby forming a heterojunction with intrinsic thin layer (HJT) structure, and
- wherein the silicon lower cell is configured such that at least a portion of its lower surface is formed with pyramid-shaped concavo-convex structure, and the pyramid-shaped concavo-convex structure has a pyramid angle of greater than 30°.

2. The solar cell of claim 1, wherein the perovskite absorbing layer is configured to have a thickness of 650 nm to 1,700 nm.

3. The solar cell of claim 1, wherein the perovskite upper cell is configured to have a band gap of less than 1.66 eV.

4. The solar cell of claim 1, wherein the silicon lower cell further includes a passivation layer on the lower surface of the silicon layer, and the first grid electrode is disposed on the passivation layer.

5. The solar cell of claim 1, wherein the interconnecting layer is configured to be a recombination layer or an intermediate layer including at least one selected from the group consisting of a transparent conductive oxide, a carbonaceous conductive material, a metallic material, and a conductive polymer.

6. The solar cell of claim 5, wherein the bifacial light-receiving silicon/perovskite tandem solar cell is configured to be:
- a two-terminal bifacial light-receiving silicon/perovskite tandem solar cell in which the perovskite upper cell further includes a second grid electrode on an upper side of the perovskite absorbing layer, when the interconnecting layer is a recombination layer, or
- a four-terminal bifacial light-receiving silicon/perovskite tandem solar cell in which the silicon lower cell further includes a second grid electrode disposed on the silicon layer, when the interconnecting layer is the intermediate layer.

7. A bifacial light-receiving silicon/perovskite tandem solar cell, comprising:
- a silicon lower cell configured to include a silicon layer and a first grid electrode disposed on a lower surface of the silicon layer;
- an interconnecting layer disposed on the silicon lower cell; and
- a perovskite upper cell disposed on the interconnecting layer and configured to include an upper surface;
- wherein the lower surface of the silicon layer includes a pyramid-shaped concave-convex structure,
- wherein the upper surface of the perovskite upper cell includes a planar surface or a textured surface, and
- wherein the silicon layer of the silicon lower cell comprises a crystalline silicon substrate and further includes a p-type amorphous silicon layer, an n-type amorphous silicon layer, and an amorphous intrinsic silicon layer each disposed on the crystalline silicon substrate, thereby forming a heterojunction with intrinsic thin layer (HJT) structure,
- wherein the pyramid-shaped concavo-convex structure has a pyramid angle of greater than 30°.

8. The solar cell of claim 7, wherein the pyramid-shaped concave-convex structure has a pyramid angle in a range from 30° to 60°.

9. The solar cell of claim 7, wherein the perovskite upper cell includes a hole transport layer, a perovskite absorbing layer, an electron transport layer, and a transparent electrode layer.

10. The solar cell of claim 9, wherein the transparent electrode layer includes at least one selected from a group consisting of a transparent conductive oxide, a carbonaceous conductive material, a metallic material, and a conductive polymer.

11. The solar cell of claim 9, wherein the perovskite upper cell includes a second grid electrode disposed on the transparent electrode layer.

12. The solar cell of claim 11, wherein the perovskite upper cell includes an antireflection film on the transparent electrode layer.

13. The solar cell of claim 12, wherein the second grid electrode is connected to the transparent electrode layer passing through the antireflection film.

14. The solar cell of claim 9, wherein the perovskite absorbing layer is represented by a formula (I):

$$AMX_3 \quad \text{(I)}$$

wherein A is a monovalent organic ammonium cation or metal cation, M is a divalent metal cation, and X is a halogen anion.

15. The solar cell of claim 14, wherein the perovskite absorbing layer includes at least one selected from a group consisting of a $CH_3NH_3PbI_3$, $CH_3NH_3PbI_xCl_{3-x}$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$ ($0 \leq x, y \leq 1$).

16. The solar cell of claim 9, wherein the interconnecting layer includes at least one selected from a group consisting of a transparent conductive oxide, a carbonaceous conductive material, a metallic material, and a conductive polymer.

* * * * *